Aug. 31, 1965 J. R. G. COLLARD 3,203,477

CRYOGENIC COOLING DEVICES

Filed Nov. 21, 1962 2 Sheets-Sheet 1

INVENTOR.
JACQUES R. G. COLLARD
BY [signature]
ATTORNEY

Aug. 31, 1965 J. R. G. COLLARD 3,203,477

CRYOGENIC COOLING DEVICES

Filed Nov. 21, 1962 2 Sheets-Sheet 2

INVENTOR.
JACQUES R. G. COLLARD
BY [signature]
ATTORNEY 3,203,477

CRYOGENIC COOLING DEVICES

Jacques R. G. Collard, Nutley, N.J., assignor to International Telephone and Telegraph Corporation, Nutley, N.J., a corporation of Maryland Filed Nov. 21, 1962, Ser. No. 239,127
10 Claims. (Cl. 165—48)

This invention relates to cryogenic cooling devices and more particularly to a cryogenic cooling device for low-noise amplifiers.

It is well known that the thermal noise level of certain electronic devices may be reduced by lowering the components' temperatures. This is usually achieved by cooling the entire device. In the case of parametric amplifier diodes, the usual approaches have been to cool either the parametric amplifier cavity or both the circulator and the amplifier cavity. When cooling the parametric amplifier cavity, the cavity must be filled with a dry gas or evacuated. In this case, the cryogen consumption is very large, especially during cooling down. Also the tuning elements must be hermetically sealed and are not easily accessible. When cooling the circulator and amplifier cavity, the same disadvantages are present and also the added disadvantage that the amplifier does not operate well at room temperature due to the particular circulator device.

An object of my invention is the provision of a device for cooling electronic components without cooling the apparatus associated with the components.

A further object of my invention is the provision of means for cooling electronic components which automatically adjusts itself to a varying heat load.

Another object of my invention is the prevention of frost formation on cooled components without evacuating the area around them or hermetically sealing them.

Still another object of my invention is the provision of a device which can be operated indifferently at room temperature or cryogenic temperature without requiring large structural changes.

A novel feature of my invention is the provision of a vacuum insulated vaporizer wherein the cryogenic liquid is used to cool the components and the gas formed by the cryogenic liquid is flushed around the cooled components to prevent the surrounding air from coming in contact with them and forming ice on the components.

Another feature of my invention is the provision of a cooling device for cooling the diode of a parametric amplifier which can be adapted to the parametric amplifier without causing an appreciable disturbance in the fields formed in the parametric amplifier cavity.

Still another novel feature of my invention is the use of a heat exchanger as a means for cooling articles and the provision of potentiometer type means for controlling the amount of cooling done according to the heat requirements of the articles.

The above-mentioned and other features and objects of this invention will become more apparent by reference to the following description taken in conjunction with the accompanying drawings in which.

Figure 1:
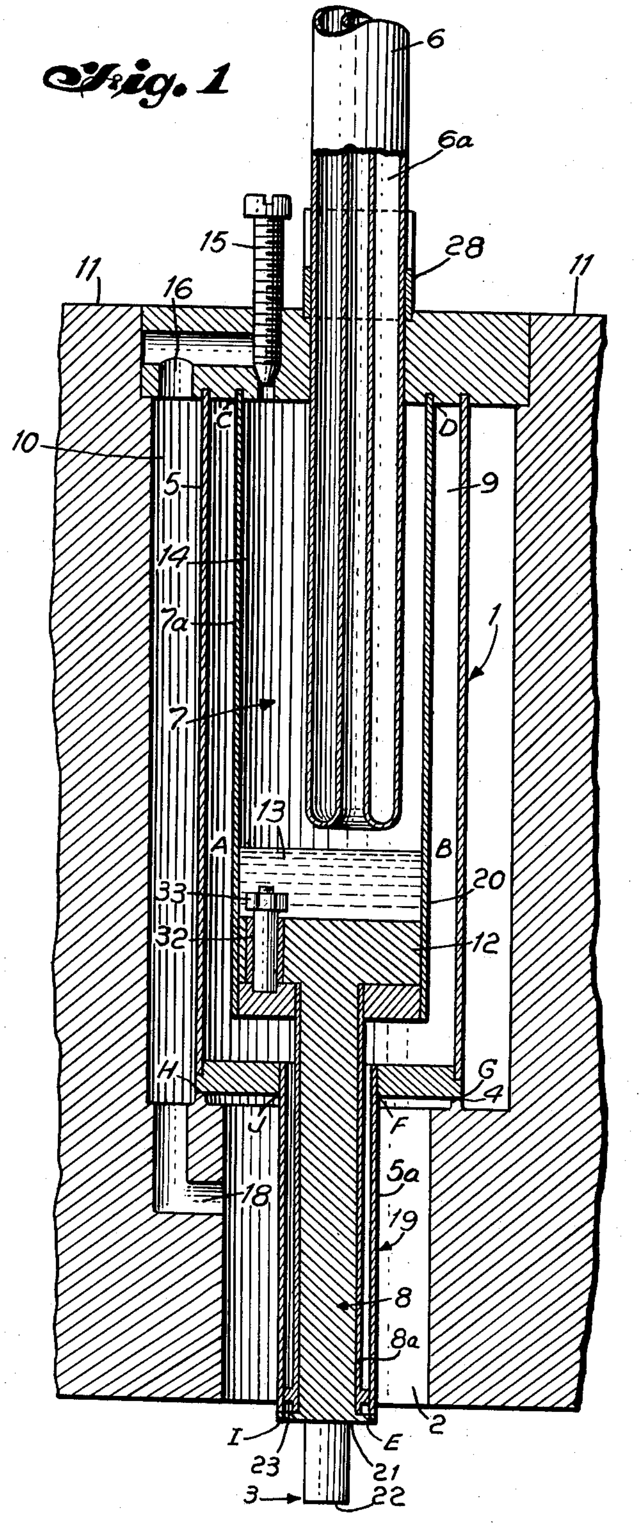
FIGURE 1 is a schematic representation of a cooling device in accordance with my invention.

Referring now to FIGURE 1, there is disclosed a schematic representation of a cooling device 1 partially disposed within the cavity 2 of a parametric amplifier in accordance with my invention. The heat load 3 consists of the diode of the parametric amplifier. The diode can be inductively coupled with a signal frequency, a pump frequency, and an idler frequency by means well known to the prior art. The components used may be coupled to the apparatus they are associated with by any desired means. If leads are used they can be treated as constant losses once the proper constant is determined empirically or otherwise. The cooling device 1 rests on annular ridge 4 which effectively short circuits any R.F. or D.C. signals in cavity 2 so that its presence causes a minimum of disturbance in the electromagnetic fields induced. Cryogenic fluid is fed through vacuum insulated line 6 into chamber 7. Annular chamber *6a* is evacuated. The fluid may be any cryogenic fluid and for illustration is nitrogen in this case. A gravity feed system may be used to feed the liquid nitrogen at a constant rate into chamber 7 through vacuum insulated line 6. Other types of feed systems may be used such as pressurized feed systems or ones employing Joule-Thompson expanders. Chamber 7 has a circular cross-section and is constructed of a good heat insulating material, such as stainless steel. Heat exchanger 8 is composed of highly conductive material, such as copper, and has a circular cross-section. It is disposed in the bottom of chamber 7 and is encased in a sleeve *8a* which forms another chamber extending downwardly from chamber 7. It supports heat load 3. An annular chamber 9 completely surrounds chamber 7 and heat exchanger 8. Chamber 9 is evacuated to provide vacuum insulation of the internal cold section from the external annular cavity 10 between my cooling device 1 and a large heat sink 11. The top portion 12 of heat exchanger 8 has approximately the same diameter as chamber 7 and seals the cryogenic fluid 13 within the upper portion 14 of chamber 7. Adjustable needle valve 15 regulates the pressure in chamber 7 and thereby regulates the flow of cryogenic fluid 13 by setting the differential pressure between chamber 7 and the fluid feed device (31, FIGURE 5) attached to line 6. Vacuum insulated line 6 should have a relatively small diameter which must be determined for each device. This is required to avoid a two-way flow in the line. When the vapor pressure in chamber 7 is high enough it will force the liquid back in the vacuum insulated line 6. Actually the liquid itself will evaporate in line 6 and bubble up through line 6. If line 6 is sufficiently large fluid will flow downwards due to gravity and the quantity of liquid while the vapor will bubble up through it. I have found that this causes noise to be produced in the amplifier. By using a small diameter vacuum insulated line 6, the vapor pressure can control the amount of flow of liquid without causing noise in the components which are cooled.

The liquid nitrogen 13 evaporates at a rapid rate on contact with top 12 to cool heat exchanger 8. When heat exchanger 8 is cooled to the temperature of liquid nitrogen, 77° Kelvin, the nitrogen will evaporate at a much slower and constant rate and a supply of liquid nitrogen will be built up. Evaporated nitrogen is conveyed via external piping 16, cavity 10, and external piping 18 into the parametric amplifier cavity 2. It circulates around heat load 3 and prevents moisture from forming. The nitrogen gas is evolved as soon as liquid nitrogen is introduced into chamber 7 and almost instantaneously circulates around the heat load 3 which is continuously flushed throughout the operation of cooling device 1. Thus, the component which is cooled need not be vacuum or hermetically sealed in order to prevent the formation of ice on it.

The rate of flow of cold ($R_1$) out of wall 7_a_ of chamber 7 can be calculated in calories by multiplying the cross-sectional area ($A_1$) in centimeters squared of wall 7_a_ above the liquid nitrogen pool 13 times the conductivity ($C_1$) in calories per degree Kelvin-centimeters) of wall 7_a_ times one over the length ($L_1$) in centimeters of the path from the top of the pool of liquid nitrogen AB to the top of chamber 7 CD times the change in temperature (T) in degrees Kelvin applied to the system by changes in the ambient temperature in the heat load.

$$R_1=\frac{A_1}{L_1}TC_1 \qquad (1)$$

This rate of flow of cold does not include the cold flow radiating from the wall 7_a_ of chamber 7. The amount of change of radiant cold flow due to the change in the level of the liquid nitrogen AB is negligible as compared with the conduction loss along wall 7_a_ to heat sink 11. This loss is analogous to an electrical current flow which decreases with increased resistance. The longer the path $L_1$ is the greater will be the resistance to the flow of cold from the cryogenic fluid. Thus the flow of cold out of chamber 7 will decrease when $L_1$ increases and increase when $L_1$ decreases.

The portion 20 of chamber 7 adjacent the liquid nitrogen 13 does not constitute a cold loss as it is at liquid nitrogen temperature. Heat exchanger 8 short circuits the cold from the liquid nitrogen 13 to the heat load 3 so that heat exchanger 8 is at approximately 77° Kelvin. There is a loss of 6 or 7 degrees Kelvin due to the connection between heat load 3 and heat exchanger 8. In operation, it has been found that the loss between upper portion 21 of heat load 3 and bottom portion 22 amounts to about 30° Kelvin in the case of certain diodes which are actually maintained at approximately 110° Kelvin.

Another source of loss due to conduction is the loss from heat exchanger 8 via flange 23 formed on the sleeve 8_a_ to heat sink 11 through the portion EFG of wall 5_a_. The amount of calories lost ($R_2$) is equal to the cross-sectional area ($A_2$) of wall 5_a_ times the conductivity ($C_2$) of the material times the change in temperature (T) in degrees Kelvin divided by the length ($L_2$) of portion EFG. Naturally the fact that the cross-sectional area from F to G is not the same as from E to F must be taken into account.

$$R_1=\frac{A_2}{L_2}TC_2 \qquad (2)$$

It can be seen by noting the parameters used in Equation 2 that they are all constants except for T. The heat loss through chamber 7 depends on parameters which are all constants except for length $L_1$ which will vary with level AB and the change in temperature T. The thickness and length of portion EFG is calculated so that surface HG is at room temperature when the flanged portion 23 of heat exchanger 8 is at liquid nitrogen temperature. This is always so when there is liquid nitrogen in chamber 7 as heat exchanger 8 short circuits the cold from the nitrogen to the load. Since HG is at room temperature the microwave structure remains at room temperature and does not constitute an additional cold drain on the cold source. The wall thickness of chamber 7 is calculated so that with the liquid level a certain distance away from heat exchanger 8, for instance, surface AB, the top CD will be at room temperature while AB is at liquid nitrogen temperature. Thus, the entire heat sink 11 is at room temperature as the portions of cooling device 1 adjacent the heat sink 11 are at room temperature. The total heat load consisting of heat exchanger 8 and heat load 3 is effectively connected to the heat sink through two long cylinders, namely ABCD on one side and FEIJ on the other side.

The main feature of my cooling device is the automatic adjustment of the liquid level AB under varying heat load conditions. The liquid level changes, with changes in temperature causing the pressure in the chamber to vary with the changes in temperature. The usual method of controlling the flow of coolant or cryogenic fluid have been dependent on coolant consumption and not on ambient temperature changes. The balancing of the two long cylinders which comprise the heat losses is analogous to that of a self-adjusting potential divider. As the temperature increases, the boiling rate increases dropping level AB, which will in turn increase the length $L_1$. There will be an exchange of cold from the liquid nitrogen in favor of the useful load. A new lower liquid level will stabilize when the heat load increase in calorie consumption is equal to the decrease in calorie consumption to heat sink 11 through chamber 7. If the temperature decreases, level AB will rise until the decrease in calorie consumption is equal to the increase in calorie consumption to heat sink 11 through chamber 7. The exchange of cold in one direction and calories in the other is instantaneous as there is always a large cold source so that heat load 3 is maintained at a constant temperature. Changes in temperature which act on load 3 are immediately compensated via heat exchanger 8 and the coolant used.

The actual loss in calories in the heat load is very small. It is the ambient temperature of the surrounding equipment which must be compensated for. Thus the system will usually be compensating for temperature changes in the heat sink. The dry gas in chamber 10 will tend to cool heat sink 11 and also cooling device 1 to cause it to operate more efficiently.

Figure 2:
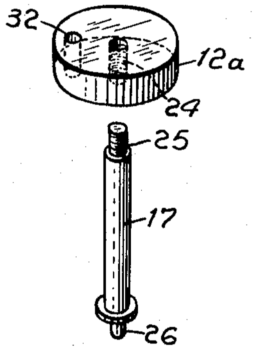
FIGURE 2 is a perspective view of a heat exchanger in accordance with my invention.

Heat exchanger 8 may consist of a separate stem 17 and top 12_a_ as shown in FIGURE 2. Top 12_a_ having tapped hole 24 will be disposed in chamber 7. Threaded portion 25 of stem 17 corresponds to tapped hole 24 so that it can be screwed into hole 24 after having a component or desired heat load attached to extended portion 26. Stem 17 should not be screwed too tightly in top 12_a_ as different materials are used to form prong 19 (FIGURE 1) and stem 17. Since the materials will have different coefficients of expansion, changes in temperature will cause one to contract or expand more than the other. For example, it has been found that when stem 17 is made of copper and prong 19 is made of stainless steel, prong 19 will be crimped if there is not enough play between the prong and the stem before the cryogenic fluid is used as copper constricts more than steel. Top 12_a_ may be slidably mounted in chamber 7 by means of bolt 33 in hole 32. Once cryogenic fluid is applied to heat exchanger 8, the bottom of top 12_a_ will be held against the bottom of chamber 7 thus restricting any possible fluid flow.

Figure 3:
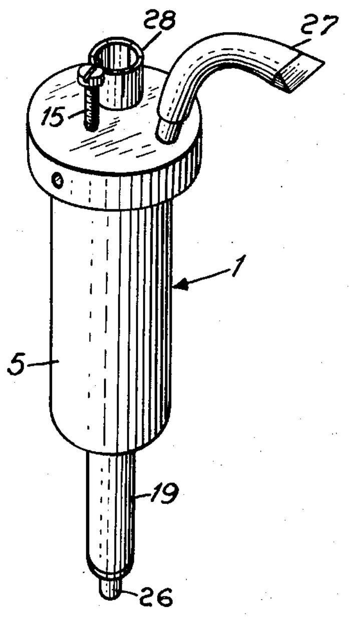
FIGURE 3 is a perspective view of a heat exchanger in accordance with my invention.
Figure 4:
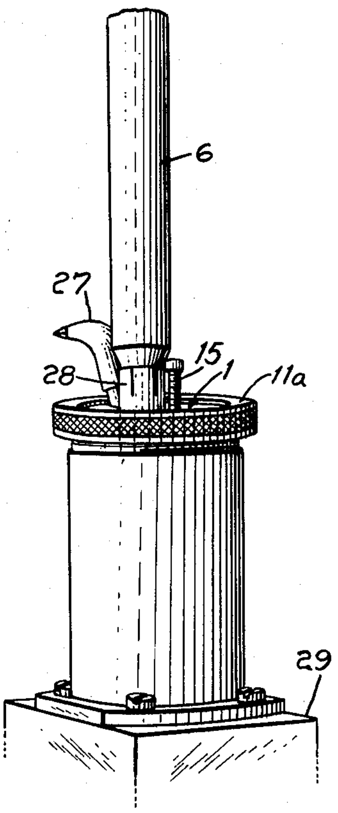
FIGURE 4 is a perspective view of my cooling device incorporated in a heat sink in accordance with my invention.
Figure 5:
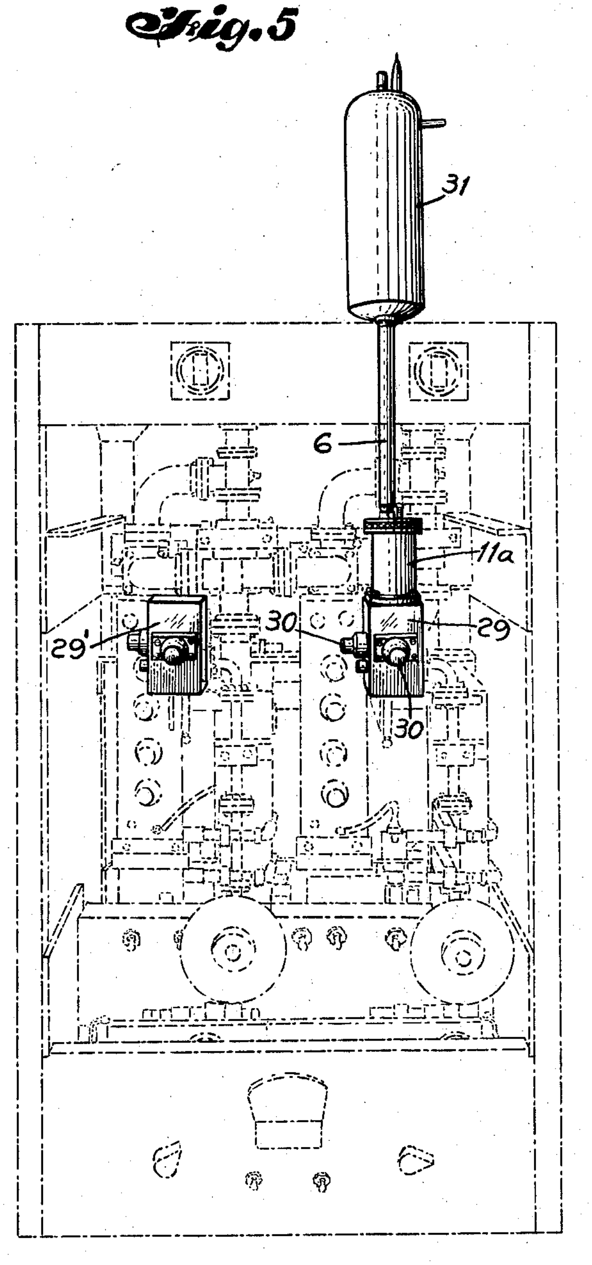
FIGURE 5 is a plan view of apparatus incorporating my cooling device.

Referring now to FIGURE 3 in which there is disclosed a perspective view of cooling device 1. Vacuum seal 27 seals chamber 9. Aperture 28 communicates with chamber 7. In FIGURE 4 it can be seen that cryogenic fluid is fed through vacuum insulated line 6 connected to aperture 28. The entire cooling device 1 is placed in a large heat sink 11_a_ which is rigidly attached to the electronic device having the component which is desired to be cooled. In FIGURE 4 the electronic device consists of a parametric amplifier 29. In FIGURE 5 it can be seen that parametric amplifier 29 can be associated with surrounding apparatus without affecting the temperature of the apparatus. Thus the surrounding apparatus and the controls 30 for the parametric amplifiers can be easily manipulated. A vessel of liquid nitrogen 31 can be attached to vacuum insulated line 6 whenever it is desired to cool the diode of parametric amplifier 29. Line 6 can be as long or short as desired depending on the space availability of the surrounding apparatus desired. It can be seen that my device can be easily inserted into or removed from this system. Note that a second parametric amplifier 29' is not being cooled. Since annular ridge 4 in contact with my cooling device 1 acts as a short circuit for R.F. and D.C. signals, my device may be left in the system and used when desired by applying a vessel 31 of cryogenic fluid to it. Naturally this process can be made continuous by salvaging the vaporized coolant and feeding it back to the coolant feeding device employed. A vessel containing only about five liters of nitrogen is sufficient for at least twenty-four hours. Many alternative arrangements are possible with my device. For instance, a plurality of heat exchanging stems may be used so that more than one article may be cooled at one time.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A cooling device utilizing a coolant for cooling an article comprising:
(a) a liquid coolant which vaporizes when it adsorbs heat;
(b) a heat sink;
(c) means forming a cylindrical cavity in said heat sink;
(d) a disc-shaped member disposed in closure relationship to said cavity;
(e) means forming a first cylindrical chamber attached to said disc-shaped member and disposed within and apart from the walls of said cavity;
(f) means forming a second cylindrical chamber, coupled to said first cylindrical chamber and disposed within and apart from the walls of said cavity, said second chamber being open to said first chamber;
(g) means forming a third cylindrical chamber attached to said disc-shaped member and coaxial with said first chamber, said disc-shaped member having an aperture therein communicating with said third chamber;
(h) means forming a fourth cylindrical chamber attached to said third-chamber-forming means and coaxially disposed within said first and second chambers, said fourth chamber being open to said third chamber, the annular chamber formed by the inner walls of said first and second chambers, the outer walls of said third and fourth chambers, said disc-shaped member, and the bottom of said second chamber being evacuated;
(i) means for feeding said coolant through said aperture into said third chamber;
(j) means for conducting the vapor formed by said coolant in said third chamber from said third chamber;
(k) thermal conducting means disposed in said fourth chamber in contact with said coolant in said third chamber, said thermal conducting means being adapted to contact an article to be cooled; and
(l) means responsive to the flow of said vapor from said third chamber adapted to prevent the formation of frost on said article when said article is not sealed from the atmosphere.

2. In a parametric amplifier, the combination comprising:
(a) a diode to be cooled;
(b) a liquid coolant which vaporizes when it adsorbs heat;
(c) a heat sink;
(d) means forming a cylindrical cavity in said heat sink;
(e) a disc-shaped member disposed in closure relationship to said cavity;
(f) means forming a first cylindrical chamber attached to said disc-shaped member and disposed within and apart from the walls of said cavity;
(g) means forming a second cylindrical chamber, coupled to said first cylindrical chamber and disposed within and apart from the walls of said cavity, said second chamber being open to said first chamber;
(h) means forming a third chamber attached to said disc-shaped member and coaxial with said first chamber, said disc-shaped member having an aperture therein communicating with said third chamber;
(i) means forming a fourth chamber attached to said third-chamber-forming means and coaxially disposed within said first and second chambers, said fourth chamber being open to said third chamber, the annular chamber formed by the inner walls of said first and second chambers, the outer walls of said third and fourth chambers, said disc-shaped member, and the bottom of said second chamber being evacuated;
(j) means for feeding said coolant through said aperture into said third chamber;
(k) means for conducting the vapor formed by said coolant in said third chamber from said third chamber;
(l) thermal conducting means in contact with said coolant in said third chamber, extending through said fourth chamber, and in contact with said diode; and
(m) means responsive to the flow of said vapor from said third chamber adapted to prevent the formation of frost on said diode when said diode is not sealed from the atmosphere.

3. A cooling device for cooling an article comprising:
(a) a coolant which changes into vapor when it absorbs heat;
(b) means forming a chamber for said coolant, said chamber having an aperture;
(c) thermal conducting means within said chamber in contact with said coolant and having a portion thereof projecting through the aperture in said chamber, said projecting portion having an article contacting surface for contacting a portion only of the article to be cooled, thereby providing a thermal flow between said coolant and said article; and
(d) means for conveying said vapor over the portion of said thermal conducting means having the article contacting surface and into contact with the surfaces of said article which are out of contact with said thermal conducting means for preventing the formation of frost on the said out-of-contact surfaces of said article.

4. A device, according to claim 3, wherein said preventive means comprises means for continuously circulating said vapor around said component.

5. A cooling device, according to claim 4, wherein said means for conducting a thermal flow includes a member composed of highly conductive material.

6. A cooling device, according to claim 5, wherein said chamber formed by said chamber-forming means is cylindrical, and further comprising: a disc shaped member attached to said means to form one end of said chamber, said aperture being located in the opposite end of said chamber; and means forming an annular chamber surrounding said chamber and said projecting portion of said conductive member, said annular chamber being evacuated.

7. A cooling device, according to claim 6, further comprising: a disc member having an aperture therein; means for feeding said coolant to said chamber through said aperture in said disc member, and pressure responsive means for controlling the amount of coolant fed to said chamber.

8. A cooling device, according to claim 7, further comprising thermal conductive means for controlling the amount of coolant vaporized in said chamber.

9. A device, according to claim 1 wherein the diameter of said cavity decreases in a step, forming a first portion of one diameter and a second portion of a smaller diameter, said disc member being supported by said first portion and further comprising an annular ridge on the shoulder formed between said first and second portions which contacts the bottom of said first chamber forming means.

10. A device, according to claim 9, wherein said means for preventing the formation of frost includes:

(a) a pressure responsive valve in said disc member;

(b) a disc member having channels therein, said channels cooperating with said pressure responsive valve to convey vapor exceeding a desired pressure out of said third chamber and into the space between said cavity and the wall of said first chamber; and (c) a heat sink having channels therein, said channels connecting the space between said cavity and said wall of said first chamber with the space between said cavity and the wall of said second chamber wherein the wall of said cavity adjacent said second chamber directs the flow of said vapor to said article.

References Cited by the Examiner

UNITED STATES PATENTS

| | | | |
|---|---|---|---|
| 2,958,021 | 10/60 | Cornelison et al. | 165—105 |
| 3,006,157 | 10/61 | Haettinger et al. | 62—259 |
| 3,079,504 | 2/63 | Hutchens | 62—259 |

ROBERT A. O'LEARY, *Primary Examiner.*

KENNETH W. SPRAGUE, CHARLES SUKALO, *Examiners.*